United States Patent
Moors et al.

(10) Patent No.: US 6,980,281 B2
(45) Date of Patent: Dec. 27, 2005

(54) LITHOGRAPHIC APPARATUS AND DEVICE MANUFACTURING METHOD

(75) Inventors: Johannes Hubertus Josephina Moors, Helmond (NL); Uwe Mickan, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/762,565

(22) Filed: Jan. 23, 2004

(65) Prior Publication Data

US 2005/0162629 A1   Jul. 28, 2005

(51) Int. Cl.[7] .................. G03B 27/32; G03B 27/42; G03B 27/54
(52) U.S. Cl. ................... 355/67; 355/53; 355/77
(58) Field of Search .................. 355/67, 53, 171, 355/40, 77, 71; 356/237.1, 239

(56) References Cited

U.S. PATENT DOCUMENTS

| | | | |
|---|---|---|---|
| 5,317,615 A | 5/1994 | Ebinuma et al. | |
| 6,377,651 B1 | 4/2002 | Richardson et al. | |
| 6,621,556 B2 * | 9/2003 | Iwasaki et al. | 355/53 |
| 6,795,166 B2 * | 9/2004 | Kato et al. | 355/67 |
| 6,862,076 B2 * | 3/2005 | Mulder et al. | 355/40 |
| 2003/0053594 A1 | 3/2003 | Fornaciari et al. | |

* cited by examiner

*Primary Examiner*—Judy Nguyen
*Assistant Examiner*—Kevin Gutierrez
(74) *Attorney, Agent, or Firm*—Pillsbury Winthrop Shaw Pittman LLP

(57) ABSTRACT

In a lithographic apparatus, a beam of radiation passes along a beam path to a substrate, for applying patterned illumination to the substrate. An exchangeable aperture screen is inserted in the beam path to partially block out the beam from a remainder of the path onto the substrate. A test surface is provided on the aperture screen, so that the test surface receives a part of the beam that is not passed along the remainder of the beam path. The test surface is made of a material that is sensitive, under influence of radiation from the beam, to chemical alterations that also affect the optical element under influence of radiation from the beam. The test surface is later analyzed for chemical alterations after exposure to the beam.

17 Claims, 3 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Brief Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "canning"-direction) while synchronously scanning the substrate parallel or anti-parallel to this direction.

In order to create the desired pattern of illumination on the substrate the lithographic apparatus passes the beam along a path in which various optical elements are located. Most of these elements comprise lenses that serve to focus the beam and to shape its properties. In modern equipment, which uses light of extremely short wavelength, the lenses are mostly realized as mirrors. Other optical elements may merely serve as windows that atmospherically separate different chambers of the apparatus along the beam path, but pass the beam.

Another type of optical element used lithographic equipment is an aperture screen to partially block out light from the cross-section of the beam. Typically such an aperture screen (also referred to as aperture blade) is located in a pupil plane of the beam. Such aperture screens serve to shape the dependence of the intensity distribution of the beam on the angle of incidence on the substrate. Typically, different aperture screens, with differently sized or shaped openings are needed for different processing steps during integrated circuit manufacture, or for different types of integrated circuit devices. Accordingly, lithographic equipment has been provided with a storage unit for a plurality of aperture screens with differently shaped or sized openings and a handling unit to move selected aperture screens from the storage unit into an operational position in the cross-section of the beam.

Due to the ever decreasing feature size of integrated circuits it has been found necessary to reduce the wavelength of the light used in lithographic equipment to wavelengths in the UV range or even shorter. This has led to an increased risk of light induced chemical reactions at the surface of the optical elements in the beam path towards the substrate. In particular, gas molecules from the atmosphere that surrounds the optical elements may give rise to reaction products on these surfaces, such as oxides or hydrocarbon deposits, or material may even be desorbed from these surfaces. These reaction products can adversely affect imaging of patterns on to the substrate, due to changes in reflectivity or transmissivity of the optical elements. To minimize such problems, the atmosphere near the surface of the optical elements has to be carefully controlled to ensure that potentially noxious gases are not present in excessive amounts.

This makes it necessary to detect whether more than an acceptable amount of such gases is present in the atmosphere around the optical elements and to adjust parameters that affect the atmosphere if this is the case. For the detection of some gases, and for the detection of some extreme situations, it suffices to monitor the partial gas pressure. However, for other gases monitoring partial gas pressure is not sufficient. This is the case for example when the partial pressure for a gas species is excessively low in comparison with overall pressure around the optical elements. Similarly, it may be impossible to monitor subtle deviations from a desired state, if the deviations have no measurable short-term effects on the optical elements but affect the optical elements in the long term.

SUMMARY OF THE INVENTION

Among others it is an aspect of the present invention to provide a lithographic apparatus and a device manufacturing method that allow for sensitive detection whether undesirable gases are present in undesirable amounts in the atmosphere near the optical elements.

According to an aspect of the invention, there is provided a lithographic apparatus according to claim 1. According to an aspect of the invention a test surface is provided of a material that is sensitive to chemical alterations that may affect the optical element under influence of radiation from the beam. The test surface is attached to, or forms part of, an aperture screen that blocks part of the radiation from the beam. The test surface is located adjacent the opening in the screen so that the test surface intercepts a part of the light from the beam that is not passed to the substrate (adjacent, as used herein, means that no part of the test surface is in the opening, but does not exclude that there is a distance between the circumference of the opening and the test surface). Thus, no useful radiation or operation time has to be expended for exposing the test surface. Normally, the test surface is provided on the front face of the aperture screen. i.e. the face that faces the direction from which the beam arrives, but of course the test surface may also be provided on the back face when the beam is reflected back so that it traverses the aperture in two directions.

Certain aperture screens are moved into and out of the path of the beam, dependent on the type of exposure of the substrate. Typically a storage unit is provided in the lithographic apparatus, wherein different aperture screens are stored that can be moved out of and into the beam path between exposure steps of successive substrates, dependent on the desired type of illumination. Preferably the test surface is provided on such an aperture screen. This means that no direct access to the beam path, or interruption of normal operation may be required to extract the aperture screen for inspection of the test surface. Instead the aperture screen can be taken from storage.

Preferably, the test surface is made of the same material as that of an optical element such as a reflector lens that is used to pass the beam to the substrate. In the case of a test surface of reflective material the test surface may be provided at an angle with the main surface of the aperture screen that extends in the plane defined by the circumference of the opening in the screen (the angle being at least one degree for example), so that the test surface does not reflect radiation from the beam into the beam path.

Multiple test surfaces, made of different materials respectively, may be provided on the aperture screen. The materials of respective test surfaces may be chosen the same as the material of the surface of respective reflective of transmissive optical components such as windows and reflector lenses for example. Alternatively or in addition, the materials of respective test surfaces may be chosen so that each material is relatively more sensitive than the other materials to formation of one or more specific type of reaction product under influence of a respective gas component or gas component. The shape of the test surface may for example be flat, or of any other suitable shape, since it does not serve to pass the beam onto the substrate. Preferably the aperture screen with the test surface, when positioned in the beam path, is in a same compartment of the apparatus as optical elements such as lenses in the beam path, so that the test surface is exposed to the same atmosphere. However, the aperture screen with the test surface may of also be located in another compartment, provided that this has the same atmosphere as a compartment that contains optical elements such as lenses in the beam path.

After exposing the test surface to the beam, and typically after exposing the test surface many times, so that a considerable exposure duration of, say, at least ten hours or more preferably at least a hundred hours is accumulated, the test surface is analyzed for reaction products that indicate the presence of undesirable amounts of gases. If this is detected the parameters of the apparatus that affect the composition of the atmosphere near the surface of optical components can be adjusted.

By providing the test surface on the aperture screen the test surface is on one hand highly accessible for examination, because it can be taken from the storage unit for examination without directly intervening in the beam path, and on the other hand the test surface is exposed to a maximum of radiation from the beam without wasting radiation that could be used for exposing the substrate.

Preferably, different aperture screens are each provided with their own test surface. In this way it is possible to get a maximum amount of information. It may be detected for example whether there is a correlation between formation of reaction products and specific processing steps for which specific aperture screens are used.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" or "patterning structure" used herein should be broadly interpreted as referring to a device or structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF ILLUSTRATED EMBODIMENTS

Figure 1:
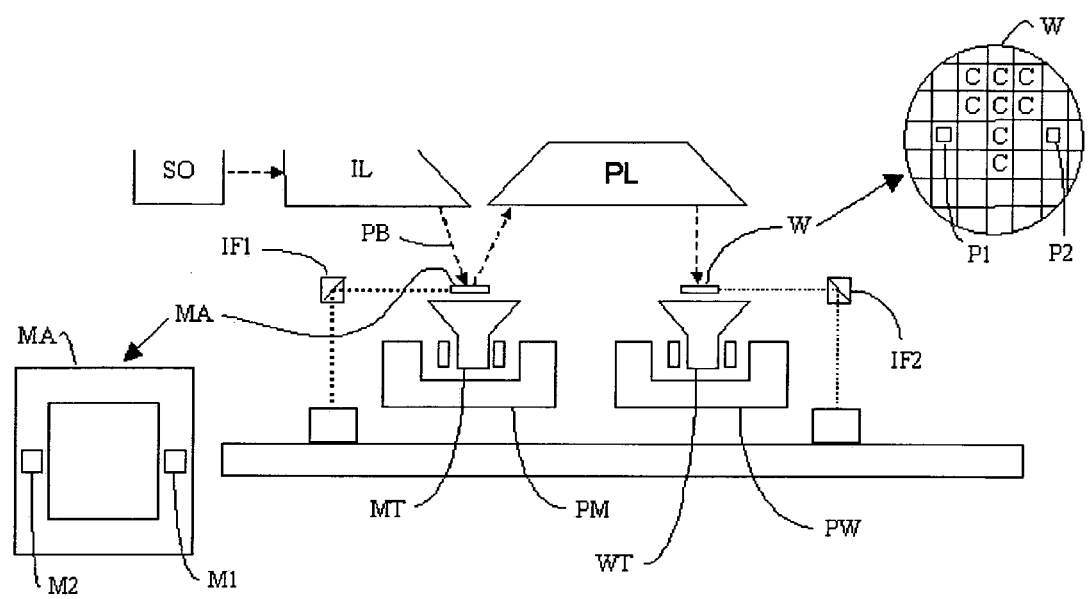
FIG. 1 depicts a lithographic apparatus according to an embodiment of the invention.

FIG. 1 schematically depicts a lithographic apparatus according to an embodiment of the invention. The apparatus comprises: an illumination system (illuminator) IL for providing a projection beam PB of radiation (e.g. UV or EUV radiation); a first support structure (e.g. a mask table) MT for supporting a patterning device (e.g. a mask) MA and connected to a first positioning structure PM for accurately positioning the patterning device with respect to item PL; a substrate table (e.g. a wafer table) WT for holding a substrate (e.g. a resist-coated wafer) W and connected to a second positioning structure PW for accurately positioning the substrate with respect to item PL; and a projection system (e.g. a reflective projection lens) PL for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask). Either one of the illumination system IL or the projection system PL individually or the illumination system IL and the projection system PL together will be referred to as "beam processing system".

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise an adjuster that adjusts the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on a patterning device, illustrated in the from of the mask MA, which is held on the mask table MT. Being reflected by the mask MA, the projection beam PB passes through the lens PL, which focuses the beam onto a target portion C of the substrate W. With the aid of the second positioning structure PW and position sensor IF2 (e.g. an interferometric device), the substrate table WT can be moved accurately, e.g. so as to position different target portions C in the path of the beam PB. Similarly, the first positioning structure PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning structure PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes.

In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the de-magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device may be updated after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

Figure 2:
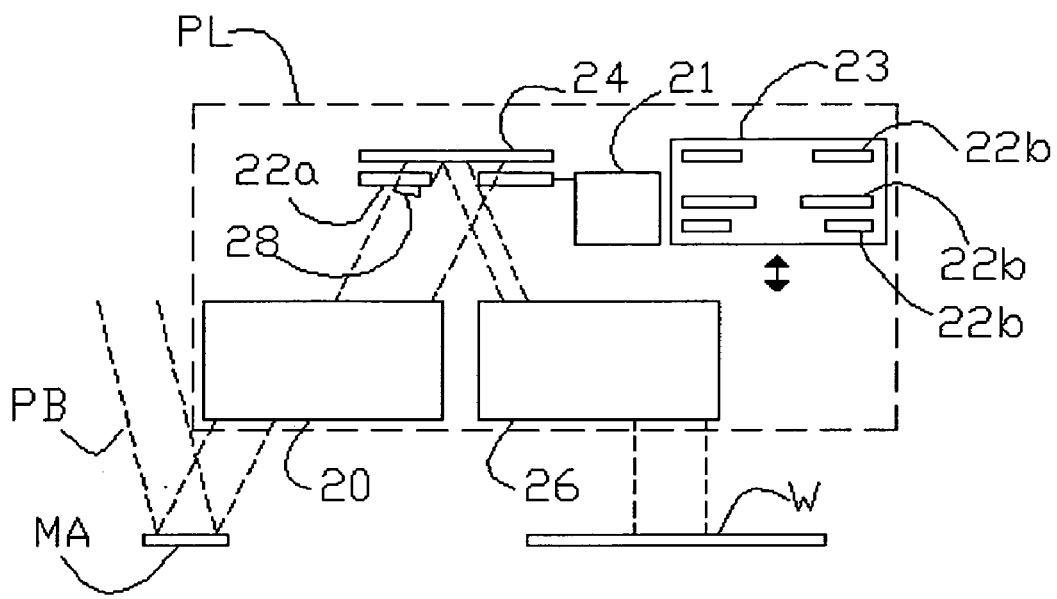
FIG. 2 shows a projection lens with an aperture blade.

FIG. 2 schematically depicts the beam path through projection lens PL. Projection lens PL is shown to contain first optical elements 20, an operational aperture blade 22a, a mirror 24 and second optical elements 26 in the path of projection beam PB. The figure also schematically shows an aperture blade storage unit 23 with inactive aperture blades 22b and a blade handler 21. Blade handler 21 serves to move aperture blades 22a,b between storage unit 23 and an operational position in the beam path, as shown for operational aperture blade 22a. It should be realized that the figure is drawn schematically, not to scale, nor even with true angles. Furthermore, although the operational position of aperture blade 22a is shown to be located closely in front of mirror 24 that reflects the beam from first optical elements 20 to second optical elements 26, so that projection beam PB passes through operational aperture blade 22a twice, it will be understood that other arrangements are possible, in which projection beam PB passes through aperture blade 22a only once, for example.

First optical elements 20, second optical elements 26 contain mirrors that have a composition which is reflective for radiation of the wavelength of projection beam PB. Mirror 24 has a similar composition. Typically, in the case of EUV radiation, a stack of alternating layers is provided on the surface of mirror 24, for example alternately using Molybdenum and Silicon, to make mirror 24 reflective for EUV. At the outer surface a protective layer, for example of Ruthenium tops of the stack of alternating layers. Of course other kinds of mirror compositions may be used. The protective layer at the outer surface serves to minimize damaging effects of chemical reactions at the surface of the mirrors under the influence of beam radiation due to gases in the apparatus.

In operation projection beam PB passes from reticle MA along a beam path through first optical elements 20, operational aperture blade 22a and is reflected by mirror 24. Subsequently projection beam PB continues along the beam path and continues through second optical elements 26 onto substrate W. At the location of operational aperture blade 22a projection beam PB substantially has a pupil plane relative to the field plane and focus plane at reticle MA and substrate W.

Figure 3:
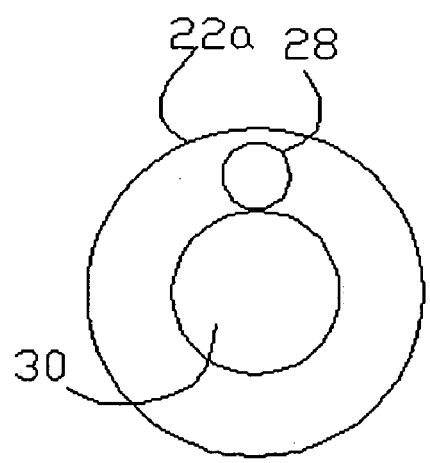
FIG. 3 shows a top view of an aperture blade.

FIG. 3 shows an aperture blade 22a with an aperture 30 in the center thereof. Operational aperture blade 22a blocks out part of projection beam PB from the beam path in the pupil plane. Typically radiation from the blocked out part of projection beam PB is absorbed at the surface of operational aperture blade 22a. Aperture blade 22a is typically made of metal without a stack of alternating materials to provide for reflection. Dependent on the processing step, or the circuit that has to be realized on substrate W different aperture blades with differently sized or shaped apertures may be used. For this purpose storage unit 23 is provided, in which a "library" of aperture blades 22b with differently sized (or shaped) apertures is stored. Handler 21 is designed to move any selectable one of the stored aperture blades from storage unit 23 into the path of projection beam PB, under control of the operator of the apparatus. Typically, handler 21 is controlled automatically, by a control computer (not shown), dependent on the type and/or stage of processing of substrate W, but instead, of course a handler 21 may be provided that operates under manual control. Storage unit 23 provides for external access, so that aperture blades can be moved into and out of storage unit 23 without accessing the beam path.

A test surface 28 is mounted on one or more of the aperture blades 22a,b (only one shown), facing a direction of incidence of projection beam PB on aperture blade 22a for detection of processes that may compromise the optical properties of the mirrors of first and second optical elements 20, 26 and/or mirror 24. A high intensity short wavelength projection beam PB, such as a EUV beam can cause reactions to occur at the surface of the mirrors. For example, in the presence of oxygen in the atmosphere at the surface of the mirrors projection beam PB may induce oxidation. Similarly, hydrocarbons present in the atmosphere may become attached to the mirrors. Metals present in the atmosphere may contaminate the mirrors. Material may also be desorbed from the mirrors.

Test surface 28 is used to detect whether these effects occur during operation. As shown in FIG. 2 test surface 28 is located on aperture blade 22a facing a direction from which projection beam PB is incident on aperture blade 22a, at a position on aperture blade 22a where projection beam PB normally has significant intensity (i.e. not outside the normal diameter of the projection beam). At least the outer layer of test surface 28 is made of the same material as that of the mirrors in projection lens PL. Hence, when test surface 28 is exposed to projection beam PB in the same atmosphere as the mirrors in projection lens PL, test surface 28 will experience the same chemical effects as the mirrors of projection lens PL. This is the case because test surface 28 is located on aperture blade 22a that is exposed to projection beam as part of normal substrate processing. No additional irradiation of test surface 28 is needed. Therefore, analysis of test surface 28 can be used to analyze whether the conditions in projection lens PL are such that a risk exists of contamination of the mirrors under influence of projection beam PB:

In operation an aperture blade 22a with a fresh (newly made and as yet unexposed) test surface 28 is entered into storage unit 23. Aperture blade 22a with test surface 28 is regularly moved into and out of projection beam as part of normal substrate processing during an extended time interval, for example, during a hundred to three hundred hours of operation. After this time interval, the aperture blade 22a with test surface 28 is removed from storage unit 23 and the characteristics of test surface 28 near the surface are analyzed, using for example XPS, Auger, AFM or EUV reflectometry. The results of the analysis are used to diagnose whether, and/or which, conditions exist in projection lens PL that are potentially harmful for the mirrors of projection lens. If any such conditions are detected corrective action may be taken.

Preferably, a record is kept of the cumulative dose of exposure of the test surface 28. When a quantitative analysis is made of material deposited or removed from the test surface 28, a ratio between the cumulative dose and the magnitude of the amount of material is determined. Corrective action is taken if this ratio passes a predetermined threshold that indicates that the magnitude is too high.

The cumulative dose of exposure may be recorded in various ways. In one embodiment a control computer (not shown) of the lithographic apparatus controls handler 21 and records for each aperture blade that contains a test surface how which dose of irradiation it has received from the beam. This may be done for example by storing for each such aperture blade a respective number that represents the cumulative dose of that aperture blade and, when an exposure dose is applied to a substrate W using an aperture blade 22a, adding a number representing that exposure dose to the respective number for the aperture blade 22a. Of course, other solutions are possible, such as recording each dose individually in association with information about the aperture blade that was used and later summing the doses for a particular aperture blade.

To a certain extent, the radiation dose at test surface 28 may also depend on the parameters of the way projection beam PB has been processed, e.g. the kind of filter used to create an intensity distribution in the pupil plane of the illuminator IL. If correction for this effect is required, the recorded dose is preferably adapted accordingly dependent on the selected parameters. The required adaptation can easily be determined, for example by measuring the dose once for various parameter settings, or by model computations. The dose at the test surface 28 may also depend slightly on the type of reticle MA used. In this case, the recorded dose may be adapted accordingly, dependent on the selected parameters.

In another embodiment a dose sensor (not shown) may be provided adjacent the test surface 28, for example on the aperture blade 22a or in the projection lens PL near the operation position of aperture blade 22a. In this case measurements from this dose sensor are recorded for each aperture blade 22a with a test surface.

Of course, the human operators of the lithographic apparatus may also keep a record of the cumulative dose, e.g. by counting the numbers of devices of respective types made and multiplying these numbers with the number of steps wherein a particular aperture blade is used during manufacture of the devices and the doses used in these steps.

When an aperture blade 22a,b is taken out of storage unit 23 for analysis of its test surface 28 this aperture blade 22a,b may be replaced by another aperture blade with the same size aperture and a fresh test surface 28, or test surface 28 may be removed from aperture blade 22a and replaced by a fresh test surface 28, after which the aperture blade 22a may be reentered into storage unit 23. For this purpose, test surface 28 is preferably provided by attaching a piece of additional material to aperture blade 22a. Typically, a piece of mirror of the same composition as the mirrors in projection lens PL is attached to aperture blade 22a.

Figure 4:
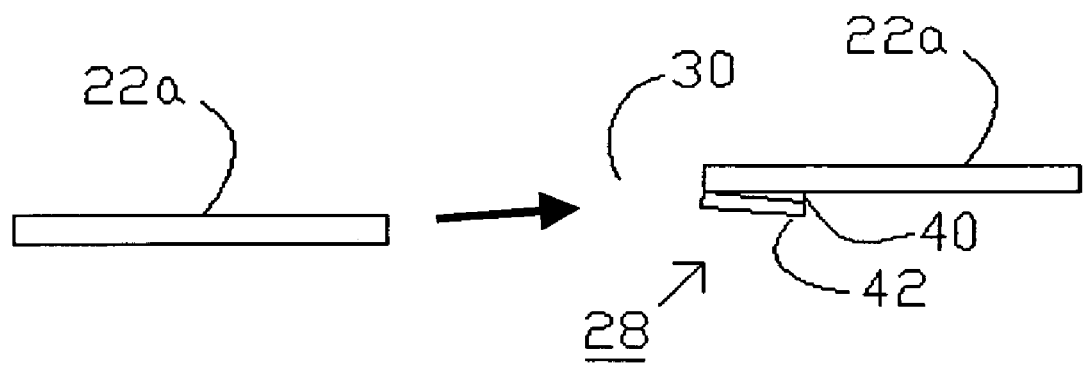
FIG. 4 shows a side view of an aperture blade.

As shown in FIG. 4, preferably, test surface 28 is mounted on aperture blade 22a so that test surface 28 is at a non-zero angle to the surface of aperture blade 22a, so that no radiation is reflected from test surface 28 into the beam path towards substrate W. This may be realized for example by providing a wedge 40 attached to aperture blade 22a and attaching mirror material 42 onto this wedge 40. Preferably, test surface 28 is mounted abutting the circumference of the aperture 30, to capture radiation from projection beam PB under as many circumstances as possible. However, if aperture 30 is sufficiently narrow, test surface 28 may also be located at a small distance from the circumference.

Although test surface 28 has been shown located at a face of aperture blade 22a that faces away from mirror 24, it should be understood that test surface 28 may also be mounted at the other face, which faces mirror 24, provided test surface 28 is located so that it receives a part of projection beam PB after reflection from mirror 24. Furthermore, it should be understood that generally more than one pupil plane is available into which aperture blades 22a,b may be moved. At any one or more of these pupil planes aperture blades 22a,b with a test surface 28 may be used.

Although a single test surface 28 has been shown mounted on aperture blade 22a, it will be understood that a plurality of distinct test surfaces 28 may be used. Thus, for example fresh test surfaces may be attached after periodic time intervals, while previous test surfaces remain in place. This makes it possible to observe temporal contamination effects in more detail. As another example, test surfaces 28 of mutually different surface finish may be used, each relatively more sensitive to one or more respective contaminants for example. In this way detection sensitivity can be increased.

Although the use of test surface 28 has so far been described for detecting potential damage to mirror surfaces, it will be understood that aspects of the invention can also be used for detecting potential damage to other types of surface, for example to detect potential damage to the surface of windows for passing projection beam PB between different compartments of the apparatus. In this case, preferably, a test surface 28 on aperture blade 22a,b is made of the material that is used for such windows.

Furthermore, although FIG. 2 explicitly shows a test surface 28 only on one of aperture blades 22a,b, it will be understood that respective test surfaces may be provided on different ones of the aperture blades 22a,b. Thus, monitoring of the conditions can take place irrespective of the choice of aperture blades. In addition, when the use of respective aperture blades is correlated with different processing steps of a semi-conductor wafer W, this makes it possible to detect whether contamination is specifically associated with specific processing steps. Alternatively, different types of test surfaces may be provided on different aperture blades 22a,b to detect different types of contamination.

In another embodiment, test surface 28 is detachably coupled to aperture blade 22a and a test surface movement mechanism is provided to move a test surface from one aperture blade 22a,b to another aperture blade 22a,b between illumination steps at which an aperture blade 22a,b with the test surface 28 is at the operational position. In this case, a plurality of aperture blades 22a,b preferably each have an attachment element for connecting test surface 28 to the aperture blade concerned and the movement mechanism is detaches test surface 28 from a first aperture blade 22a,b and reattaches the test surface to a second aperture blade 22a,b. In this way the test surface 28 can be exposed to projection beam PB more often, also when the first aperture blade 22a,b to which it was first attached is not exposed. Thus, a more sensitive detection of chemical effects of exposure can be realized.

In yet another embodiment test surface 28 is not detachable, but forms an integral part of aperture blade 22a, e.g. a part of the surface of aperture blade 22a that has the same surface layer as that of the mirrors. Thus less space may be required for the aperture blade 22a,b. But in this case, the aperture blade 22a has to be taken out of use during analysis, and possibly even after analysis.

It will be appreciated that analysis of the properties of test surface is preferably performed infrequently, after test surface 28 has received a high cumulative dose of irradiation by many repeated exposures to projection beam PB, for processing many different substrates W, e.g. after 1% or 5% of the normal service life of projection lens PL. Hence, the analysis is used to detect long term effects, due to contamination of the atmosphere in the vicinity of the mirrors at a partial pressure that is too low to be readily detectable. However, without deviating from aspects of the invention, more frequent analysis of test surface 28 may be performed, even up to after every time that a test surface 28 has been exposed. In this case, a dedicated analysis unit may be provided into which aperture blade 22a can be moved from storage unit 23 without human intervention by a handler (for example handler 21 or another suitable handler not shown).

Although aspects of the invention have been described for projection lens PL, it will be appreciated that aspects of the invention may also be applied to illuminator IL. Illuminator IL typically comprises an adjuster that adjusts the angular intensity distribution of the beam. Generally, at least the outer and/or inner radial extent (commonly referred to as σ-outer and σ-inner, respectively) of the intensity distribution in a pupil plane of the illuminator can be adjusted. This is generally realized by inserting an aperture element into the path of the beam at a pupil plane. The aperture element has one or more specifically shaped openings that selectively pass radiation of the beam. At a location on the surface of the aperture element that is irradiated by the beam, but which blocks the beam, a test surface may be provided. This can be used in a similar way as described for projection lens PL to detect potentially damaging effects due to irradiation. When the atmosphere around the mirrors of projection lens PL and the mirrors of illuminator IL is in communication, a test surface at one location, at a pupil plane in illuminator IL or in projection lens PL may be used to detect the effects of the atmosphere for mirrors in both illuminator IL or in projection lens PL. Alternatively, one or more test surfaces may be provided in both illuminator IL and projection lens PL, and/or in only one of these to detect effects in of the illuminator IL or in projection lens PL.

While specific embodiments of the invention have been described above, it will be appreciated that aspects of the invention may be practiced otherwise than as described. The description is not intended to limit the scope of aspects of the invention.

What is claimed is:

1. A lithographic apparatus comprising:
   a beam processing system for providing a beam of radiation along a beam path to a substrate, said beam processing system including at least one optical element that reflects or transmits radiation of said beam along said beam path;
   an aperture screen with an opening for permitting the passing of said beam; and
   a handling unit arranged to move said aperture screen to and from a position in said beam path for blocking out a portion of said beam from a remainder of said beam, said aperture screen having a test surface that is located adjacent said opening and arranged to receive at least a part of said portion of said beam that is blocked out from said remainder of said beam when said aperture screen is at said position, said test surface being made of a material that is sensitive, under influence of radiation from said beam, to chemical alterations that also affect said optical element under influence of radiation from said beam.

2. A lithographic apparatus according to claim 1, wherein an exposed surface of said optical element and said test surface are made of identical material.

3. A lithographic apparatus according to claim 2, wherein both said exposed surface of said optical element and said test surface are reflective for radiation of said beam.

4. A lithographic apparatus according to claim 3, wherein said test surface is arranged on said aperture screen so that said test surface makes an angle with respect to a main surface of said aperture screen, whereby said test surface reflects said beam outside of said remainder of said beam path.

5. A lithographic apparatus according to claim 1, wherein said aperture screen is substantially located in a pupil plane of said beam processing system.

6. A lithographic apparatus according to claim 1, further comprising:
   a storage element for storing said aperture screen and a plurality of additional aperture screens, said handling unit being arranged to move a selected one of said aperture screen and said plurality of additional aperture screens back and forth between said storage element and said position in said beam path.

7. A lithographic apparatus according to claim 6, wherein each of said plurality of additional aperture screens includes a respective opening and a respective additional test surface of a material that is sensitive, under influence of radiation from said beam, to chemical reactions that affect said optical element under influence of radiation from said beam, each of said additional test surfaces being located adjacent to said respective opening of said respective one of said plurality of additional aperture screens on which said additional test surface is provided.

8. A device manufacturing method comprising:
   generating a beam of radiation along a beam path to a substrate;
   inserting an exhangeable aperture screen with an opening in the beam path to block out a portion of the beam from a remainder of the beam irradiating onto the substrate, the aperture screen including a test surface, the test surface receiving at least a part of the portion of the beam that is blocked out from the remainder of the beam when the aperture screen is at the position, the test surface being made of a material that is sensitive, under influence of radiation from the beam, to chemical alterations that also affect the optical element under influence of radiation from the beam;
   exposing the test surface to radiation from the beam; and
   analyzing the test surface for chemical alterations after exposing the test surface to radiation from the beam.

9. A device manufacturing method according to claim 8, further comprising:
   exposing a plurality of substrates to the beam during respective time periods with the aperture screen in the beam path with a cumulative exposure period of the aperture screen of at least ten hours before analyzing test surface.

10. A device manufacturing method according to claim 9, wherein
    a series of substrates is exposed successively, the plurality of substrates being part of the series, and substrates other than the plurality of substrates from the series of substrates being exposed while the aperture screen has been moved out of the beam path.

11. A device manufacturing method according to claim 10, further comprising:
    positioning a further aperture screen, comprising a further test surface, in the beam path during exposure of the substrates other than the plurality of substrates.

12. A device manufacturing method according to claim 8, further comprising:
    adjusting an operational parameter that affects an atmosphere near a surface of optical elements of a lithographic apparatus that generates the beam and applies patterned illumination to the substrate, the operational parameter being adjusted in response to a result of the analyzing.

13. A device manufacturing method according to claim 8, further comprising:
    forming each of an exposed surface of an imaging optical element and the test surface of a same material.

14. A device manufacturing method according to claim 8, wherein
    the inserting an aperture screen includes positioning the aperture screen substantially in a pupil plane of the beam processing system.

15. An aperture screen for use in a lithographic apparatus, said aperture screen comprising:
    an opening for passing part of a beam; and
    a test surface located adjacent said opening and arranged to receive part of the beam that is blocked out by said aperture screen, said test surface having a material that is sensitive, under influence of radiation from the beam, to chemical alterations that also affect optical elements of the lithographic apparatus under influence of radiation from the beam.

16. An aperture screen according to claim 15, wherein said test surface is reflective for radiation in the beam.

17. An aperture screen according to claim 16, wherein said test surface is arranged so that it makes an angle with a main surface of said aperture screen, to reflect the beam out of a beam path.

* * * * *